(12) United States Patent
Marques Martins et al.

(10) Patent No.: US 10,451,669 B2
(45) Date of Patent: Oct. 22, 2019

(54) EVALUATING A GATE-SOURCE LEAKAGE CURRENT IN A TRANSISTOR DEVICE

(71) Applicant: Infineon Technologies AG, Neubiberg (DE)

(72) Inventors: Carlos Joao Marques Martins, Munich (DE); Aron Theil, Neufahrn b. Freising (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 37 days.

(21) Appl. No.: 15/720,250

(22) Filed: Sep. 29, 2017

(65) Prior Publication Data

US 2019/0101585 A1    Apr. 4, 2019

(51) Int. Cl.
*G01R 31/28*       (2006.01)
*H01L 29/78*       (2006.01)
*G01R 31/26*       (2014.01)
*G01R 31/02*       (2006.01)

(52) U.S. Cl.
CPC ....... *G01R 31/2851* (2013.01); *G01R 31/025* (2013.01); *G01R 31/2621* (2013.01); *H01L 29/7848* (2013.01)

(58) Field of Classification Search
CPC ............ G01R 31/2619; G01R 31/2617; G01R 31/2616; G01R 31/2614; G01R 31/2612; G01R 31/261; G01R 31/2608
See application file for complete search history.

(56) References Cited

U.S. PATENT DOCUMENTS

2015/0333546 A1* 11/2015 Ono ........................ H02J 7/00
                                                                                320/134
2016/0124027 A1*  5/2016 Sambucco ......... G01R 19/0092
                                                                                324/76.11

* cited by examiner

*Primary Examiner* — Tung X Nguyen
(74) *Attorney, Agent, or Firm* — Shumaker & Sieffert, P.A.

(57) ABSTRACT

Disclosed is a method, a circuit arrangement, and an electronic circuit. The method includes discharging a gate-source capacitance of a transistor device from a first voltage level to a second voltage level with a first resistor connected in parallel with the gate-source capacitance and measuring a first discharging time associated with the discharging, and discharging the gate-source capacitance from the first voltage level to the second voltage level with the first resistor and a second resistor connected in parallel with the gate-source capacitance and measuring a second discharging time associated with the discharging. The method further includes comparing a ratio between the first discharging time and the second discharging time with a predefined threshold, and detecting a fault based on the comparing.

18 Claims, 6 Drawing Sheets

US 10,451,669 B2

EVALUATING A GATE-SOURCE LEAKAGE CURRENT IN A TRANSISTOR DEVICE

TECHNICAL FIELD

This disclosure in general relates to a method and an electronic circuit for evaluating a gate-source leakage current or a gate-source resistance in a transistor device, in particular an MOS transistor device.

BACKGROUND

An MOS transistor device such as a MOSFET (Metal Oxide Semiconductor Field-Effect Transistor) or an IGBT (Insulated Gate Bipolar Transistor) is a voltage controlled transistor device which is an on-state (conducting state) or an off-state (blocking state) dependent on a charging state of an internal capacitance. This internal capacitance is connected between a control node (gate node) and a load node (source node) and is usually referred to as gate-source capacitance. In the on-state of the transistor device, leakage currents may occur that discharge the gate-source capacitance. Excessive leakage currents may be an indication that the transistor device is defect.

One approach to evaluate the gate-source leakage current is to apply a voltage between the gate node and the source node that is higher than a drive voltage applied between the gate node and the source node during normal operation, and to measure the current flowing between the gate node and the source node. The transistor device is considered to be defect if the current is higher than a predefined threshold. Applying a high testing voltage, however causes stress that may decrease lifetime of the transistor device. It is therefore desirable to evaluate the gate-source leakage current in a softer way.

SUMMARY

One example relates to a method. The method includes discharging a gate-source capacitance of a transistor device from a first voltage level to a second voltage level with a first resistor being connected in parallel with the gate-source capacitance and measuring a first discharging time associated with the discharging, and discharging the gate-source capacitance from the first voltage level to the second voltage level with the first resistor and a second resistor being connected in parallel with the gate-source capacitance and measuring a second discharging time associated with the discharging. The method further includes comparing a ratio between the first discharging time and the second discharging time with a predefined threshold, and detecting a fault based on the comparing.

Another example relates to a circuit arrangement. The circuit arrangement includes a transistor device with a gate node, a source node, a gate-source capacitance and between the gate node and the source node, and a gate-source resistance between the gate node and the source node, and an electronic circuit connected between the gate node and the source node and including a control circuit, a first resistor connected between the gate node and the source node, and a second resistor. The control circuit is configured, in a first test cycle, to measure a first discharging time associated with discharging the gate-source capacitance from a first voltage level to a second voltage level, in a second test cycle, to connect the second resistor between the gate node and the source node and measure a second discharging time associated with discharging the gate-source capacitance from the first voltage level to the second voltage level. The control circuit is further configured to compare a ratio between the first discharging time and the second discharging time with a predefined threshold, and to detect a fault based on the comparing.

Yet another example relates to an electronic circuit. The electronic circuit is configured to be connected to a gate node and a source node of a transistor device and includes a first resistor and a second resistor each configured to be connected between the gate node and the source node, and a control circuit. The control circuit is configured, in a first test cycle, to measure a first discharging time associated with discharging the gate-source capacitance from a first voltage level to a second voltage level with the first resistor connected between the gate node and the source node, and, in a second test cycle, to measure a second discharging time associated with discharging the gate-source capacitance from the first voltage level to the second voltage level with the first resistor and the second resistor connected between the gate node and the source node. The control circuit is further configured to compare a ratio between the first discharging time and the second discharging time with a predefined threshold, and to detect a fault based on the comparing.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
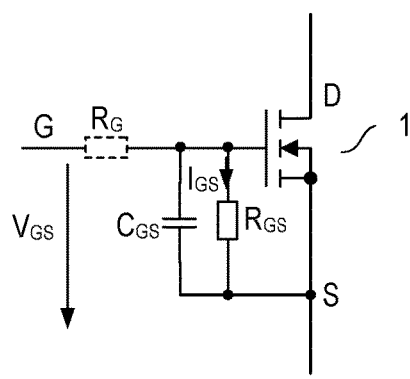
FIG. 1 shows the equivalent circuit diagram of a transistor device according to one example.

FIG. 1 illustrates one example of a transistor device 1, in particular, an MOS (Metal Oxide Semiconductor) transistor device, which may also be referred to as IG (Insulated Gate) transistor device. The transistor device includes a control node G, which is referred to as gate node in the following, a first load node S, which is referred to as source node in the following, and a second load node D, which is referred to as drain node in the following. Just for the purpose of illustration, the transistor device shown in FIG. 1 is a MOSFET (Metal Oxide Semiconductor Field-Effect Transistor), in particular, an n-type enhancement MOSFET. This, however, is only an example, the description and explanation provided in the following applies to any other type of MOS transistor device such as a p-type enhancement MOSFET, an n-type or a p-type depletion MOSFET, or an IGBT (Insulated Gate Bipolar Transistor) as well.

Figure 2A:
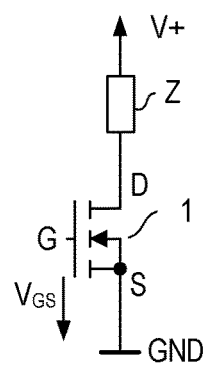
FIGS. 2A to 2C show different examples of how the transistor device may be used as an electronic switch.
Figure 2B:
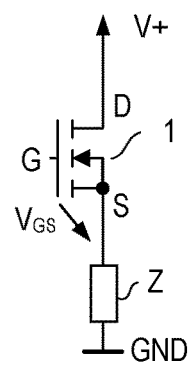
Figure 2C:
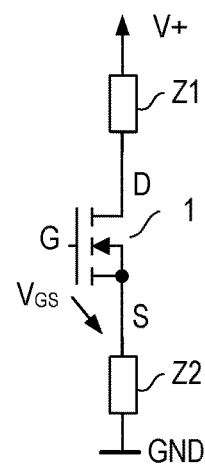

A transistor device of the type shown in FIG. 1 may be used as an electronic switch in various types of electronic circuits. Some examples of how the transistor device 1 may be used as an electronic switch are illustrated in FIGS. 2A to 2C. Referring to FIG. 2A, the transistor device 1 may be used as a low-side switch. In this case, a load path D-S between the drain node D and the source node S of the transistor device 1 is connected between a load Z and a circuit node where a negative supply potential or ground GND is available. A series circuit with the load path D-S of the transistor device 1 and the load Z is connected between a circuit node for a positive supply potential V+ and the circuit node for the negative supply potential or ground GND.

Referring to FIG. 2B, the electronic circuit may be used as a high-side switch. In this example, the load path D-S of the transistor device 1 is connected between the circuit node for the positive supply potential V+ and the load Z. According to another example shown in FIG. 2C, the load path D-S is connected between two loads Z1, Z2, wherein a series circuit that includes the loads Z1, Z2 and the load path D-S is connected between circuit nodes for the positive supply potential V+ and the negative supply potential or ground GND.

The transistor device 1 shown in FIG. 1 is a voltage controlled transistor device which is an on-state (conducting state) or an off-state (blocking state) dependent on a gate-source voltage $V_{GS}$ between the gate node G and the source node S. Internally, the transistor device includes a capacitance between the gate node G and the source node S, which is usually referred to as gate-source capacitance $C_{GS}$. This gate-source capacitance is represented by a capacitor connected between the gate node G and the source node S in the circuit diagram shown in FIG. 1. A resistor connected between the gate node G and the source node S in the circuit diagram shown in FIG. 1 represents a leakage current path. Usually, a resistance $R_{GS}$ of the leakage current path is at least several megaohms (MΩ) or at least several 10 MΩ. This, in a faultless state of the transistor device, results in a leakage current IGs of less than several microamperes (μA) if, for example, the gate-source voltage $V_{GS}$ in the on-state is about 10 volts (V). A low gate-source resistance $R_{GS}$ may be an indication that the transistor device is defect. It is therefore desirable to evaluate the gate-source resistance $R_{GS}$ or the leakage current IGs in order to detect a defect of the transistor device 1.

Figure 3:
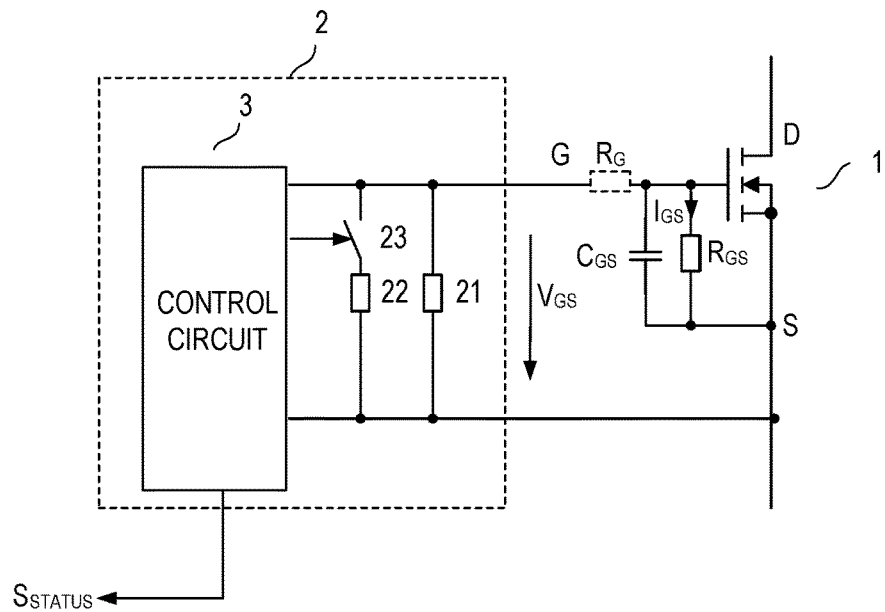
FIG. 3 shows one example of an electronic circuit with a transistor device and an electronic circuit configured to evaluate a gate-source leakage current.

FIG. 3 shows one example of an electronic circuit to configured to evaluate the gate-source resistance $R_{GS}$ or the gate-source current $I_{GS}$. The electronic circuit 2 includes a first node configured to be connected to the gate node G and a second node configured to be connected to the source node S of the transistor device 1. The electronic circuit 2 further includes a first resistor 21 connected between the first node and the second node, so that the first resistor 21 is connected between the gate node G and the source node S when the transistor device 1 is connected to the electronic circuit 2. A second resistor 22 is connected in series with an electronic switch 23, wherein a series circuit with the second resistor 22 and the electronic switch 23 is connected between the first node and the second node and, therefore, in parallel with the first resistor 21. The electronic switch 23 is controlled by a control circuit 3, wherein the second resistor 22 is connected in parallel with the first resistor 21 when the control circuit 3 switches on the electronic switch 23 and is disconnected from the gate node G and the source node S when the control circuit 3 switches off the electronic switch 23. The control circuit 3 is connected to the gate node G and the source node S in order to detect the gate-source voltage $V_{GS}$. Further, the control circuit 3 is configured to output a status signal $S_{STATUS}$ that represents a test result. According to one example, the control circuit 3 is configured to generate the status signal $S_{STATUS}$ with one of a pass level and a fail level, wherein the pass level indicates that the gate-source resistance $R_{GS}$ has passed the test and the fail level indicates that the gate-source resistance $R_{GS}$ has failed the test.

Figure 4:
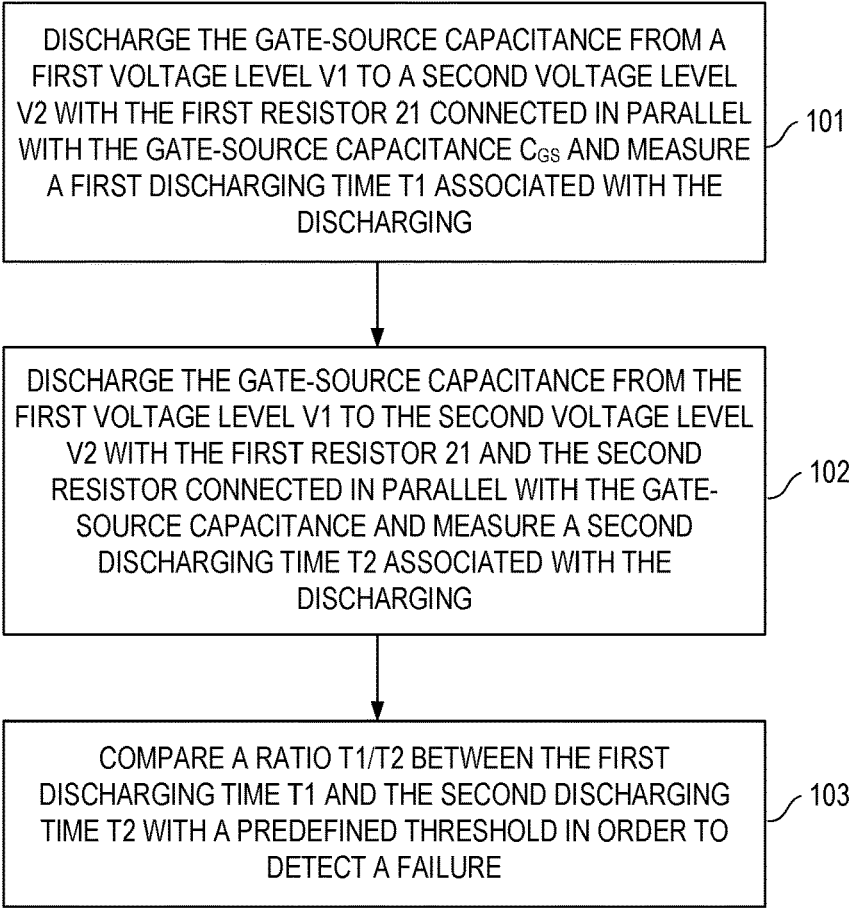
FIG. 4 is a flowchart that illustrates one example of a method for evaluating the gate-source leakage current.

One example of a method for evaluating the gate-source resistance $R_{GS}$ by the electronic circuit 2 shown in FIG. 3 is illustrated in FIG. 4. FIG. 4 shows a flowchart of the method. In a first step or test cycle 101, the method includes discharging the gate-source capacitance $C_{GS}$ from a first voltage level V1 to a second voltage level V2 with the first resistor 21 connected in parallel with the gate-source capacitance $C_{GS}$ and with the second resistor 22 not connected in parallel with the gate-source capacitance $C_{GS}$, and measuring a first discharging time T1 associated with the discharging. Thus, in the first method step 101, the control circuit 3 switches off the electronic switch 23 in order to disconnect the second resistor 22 from the gate node and the source node S. In a second method step or test cycle 102, the method includes discharging the gate-source capacitance $C_{GS}$ from the first voltage level V1 to the second voltage level V2 with the first resistor 21 and the second resistor 22 connected in parallel with the gate-source capacitance $C_{GS}$ and measuring a second discharging time T2 associated with the discharging. Naturally, the gate-source capacitance is recharged to the first voltage level V1, or higher, between the first step 101 and the second step 102. This recharging however, is not explicitly shown in the flowchart according to FIG. 4. Referring to FIG. 4, the method further includes, in a further step 103, comparing a ratio T1/T2 between the first discharging time T1 and the second discharging time T2 with a predefined threshold in order to detect a failure or an excessive leakage current.

Figure 5:
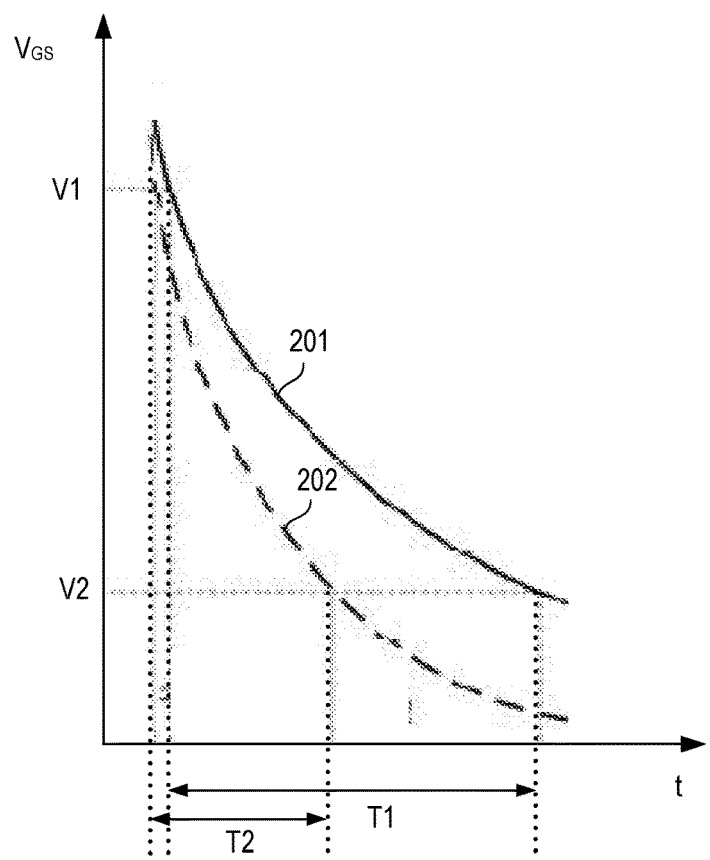
FIG. 5 shows waveforms of a gate-source voltage.

Discharging the gate-source capacitance $C_{GS}$ in the first step 101 and the second step 102 is illustrated in FIG. 5. FIG. 5 shows a first curve 201 that represents the gate-source voltage $V_{GS}$ in the first step 101, and a second curve 202 that represents the gate-source voltage $V_{GS}$ in the second step 102. The gate-source voltage $V_{GS}$ essentially equals the voltage across the gate-source capacitance $C_{GS}$. "The gate-source voltage $V_{GS}$ essentially equals the voltage across the gate-source capacitance $C_{GS}$" means that a (parasitic) gate resistance $R_G$ (illustrated in dashed lines in FIGS. 1 and 4) which is present between the gate-source capacitance $C_{GS}$ and the gate node G, is much smaller than each of the first and second resistors 21, 22. "Much smaller" means that this gate resistance $R_G$ is smaller than 0.01 ($10^{-2}$) times or even smaller than 0.001 ($10^{-3}$) times a resistance R21 of the first resistor 21 or a resistance R22 of the second resistor 22.

Basically, each of the first and second curves 201, 202 is an exponential curve, that is, the gate-source capacitance is discharged exponentially in each of the first and second steps 101, 102. In this method, the first discharging time T1 is given by $$T1 = R1 \cdot C_{GS} \cdot \ln\left(\frac{V1}{V2}\right), \quad (1a)$$

where $C_{GS}$ denotes the gate-source capacitance. $\ln(\bullet)$ denotes the natural logarithm, and R1 denotes a resistance of the parallel connection with the resistor 21 and the gate-source capacitance $R_{GS}$, that is, $$R1 = 1 / \left(\frac{1}{R_{GS}} + \frac{1}{R21}\right), \quad (2a)$$

where $R_{GS}$ denotes the gate-source resistance and R21 denotes the resistance of the first resistor 21. The second discharging time T2 can be expressed as:

$$T2 = R2 \cdot C_{GS} \cdot \ln\left(\frac{V1}{V2}\right), \quad (1b)$$

where $C_{GS}$ denotes the gate-source capacitance and R2 denotes a resistance of a parallel connection of the first resistor 21, the second resistor 22 and the gate-source resistance $R_{GS}$, that is, $$R2 = 1 / \left(\frac{1}{R_{GS}} + \frac{1}{R21} + \frac{1}{R22}\right). \quad (2b)$$

In the following, R1 and R2 are referred to as first resistance and second resistance, respectively. Based on equations (1a) and (1b), a ratio r between the first discharging time T1 and the second discharging time T2 is given by:

$$r = \frac{T1}{T2} = \frac{R1 \cdot C_{GS} \cdot \ln\left(\frac{V1}{V2}\right)}{R2 \cdot C_{GS} \cdot \ln\left(\frac{V1}{V2}\right)} = \frac{R1}{R2}. \quad (3)$$

According to one example, the first resistor R21 is selected such that its resistance R21, in a faultless state of the transistor device 1, is significantly smaller than the gate-source resistance $R_{GS}$. According to one example, the resistance R21 of the first resistor is selected such that it is less than 5% less than 1% or less than 0.1% of the gate-source resistance $R_{GS}$ in the faultless state of the transistor device 1. In this case, the first resistance R1 is governed by the resistance R21 of the first resistor 21, so that $$R1 \approx R21 \quad (4a).$$

According to one example, the second resistor 22 is also selected such that its resistance R22 is significantly smaller than the gate-source resistance $R_{GS}$. Further, the resistance R22 of the second resistor 22 is m times the resistance R21 of the first resistor 21, that is, R22=m·R21. According to one example, m is selected from between 0.01 ($10^{-2}$) and 10, in particular, from between 0.01 ($10^{-2}$) and 1. If the resistances R21 and R22 of the first and second resistor are significantly smaller than the gate-source resistance $R_{GS}$ these resistances R21, R22 govern the second resistance R2 so that the second resistance R2 is approximately given by $$R2 \approx \frac{R21 \cdot R22}{R21 + R22} = \frac{m}{m+1} \cdot R21. \quad (4b)$$

Based on equations (4a) and (4b), the ratio r between the first discharging time T1 and the second discharging time T2, in the faultless state of the transistor device 1, is $$r = \frac{m+1}{m}. \quad (5)$$

If, for example, m=1, so that R21=R22, the ratio r in the faultless state is 2 (r=2), that is, the first discharging time T1 is twice the second discharging time T2. The ratio r increases as the resistance R22 relative to the resistance R21 decreases. If, for example, R22 is 0.5 times R21, r=3. That is, the first discharging time T1 is three times the second discharging time T2.

Figure 6:
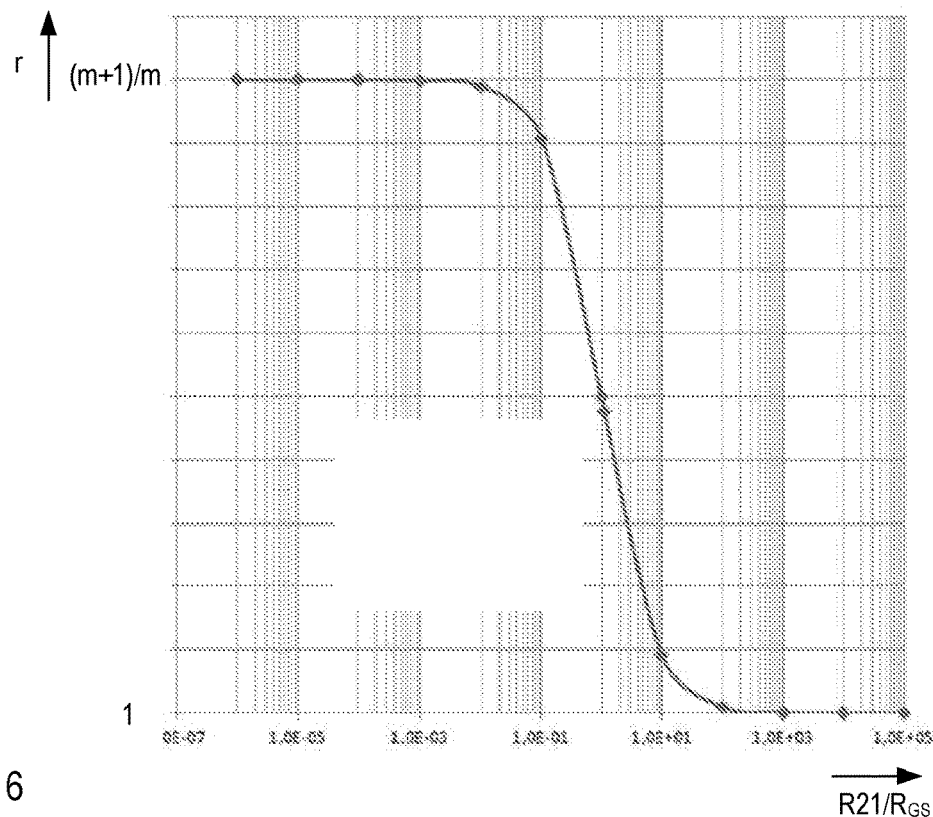
FIG. 6 illustrates a relationship between a discharging time ratio calculated in the method illustrated in FIG. 4 and a resistance ratio between a resistance of a first resistor used in the method illustrated in FIG. 4 and an internal gate-source resistance.

If, on the other hand, the transistor device is defective so that the gate-source resistance $R_{GS}$ is significantly smaller than in the faultless state. The ratio r is smaller than in the faultless state, that is, smaller than (m+1)/m. As the gate-source resistance $R_{GS}$ decreases, the ratio r approximates 1. This can easily be seen from equations (2a), (2b) and in (3). Referring to equations (2a) and (2b) each of the first resistance R1 and the second resistance R2 approximates the gate-source resistance $R_{GS}$ if the gate-source resistance $R_{GS}$ becomes significantly smaller than the resistances R21, R22 of the first and second resistor 21, 22 so that, referring to equation (3) the ratio r approximates 1. This is also illustrated in FIG. 6, which shows the ratio r dependent on a ratio R21/$R_{GS}$ between the resistance R21 of the first resistor and the gate-source resistance $R_{GS}$. The curve shown in FIG. 6 has been obtained based on m=1. As can be seen from FIG. 6, the ratio r is substantially defined by equation (5) if the gate-source resistance $R_{GS}$ is greater than 100 times R21, that is, if R21 is less than 1% of the gate-source resistance $R_{GS}$. As the gate-source resistance $R_{GS}$ decreases relative to R21, the ratio r falls below (m+1)/m and decreases towards 1.

According to one example, a fault of the transistor device 1 is detected, if the ratio r falls below a predefined threshold. According to one example, this predefined threshold is selected based on (m+1)/m. According to one example, the threshold is selected from between 0.8 times (m+1)/m and 0.999 times (m+1)/m, in particular from between 0.9 times (m+1)/m and 0.99 times (m+1)/m.

Figure 7:
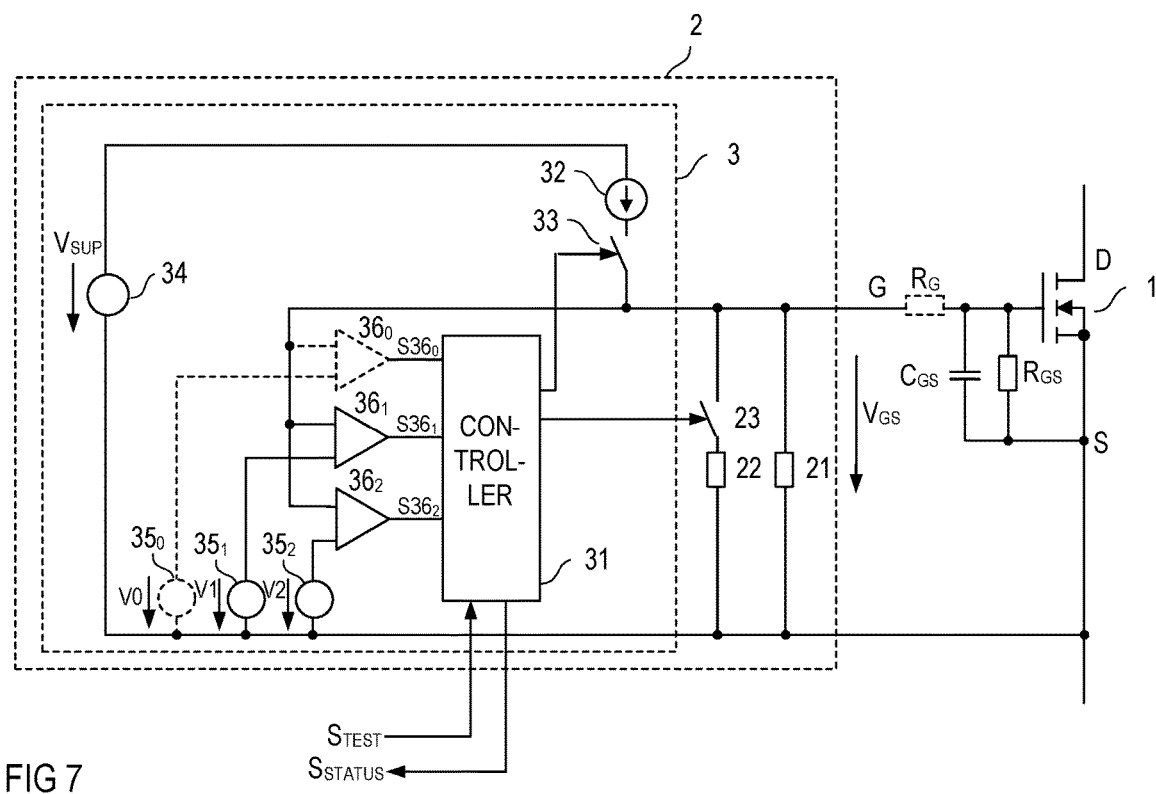
FIG. 7 shows one example of the electronic circuit in greater detail.

FIG. 7 shows one example of the control circuit 3 in greater detail.

Referring to FIG. 7, the control circuit 3 includes a controller 31 configured to control operation of the control circuit 3, a current source 32 and a voltage source 34. A series circuit with the current source 32 and the voltage source 34 is connected between the first node and the second node of the electronic circuit 2. The current source 32 is controlled by the controller 31. Referring to FIG. 7, controlling the current source 32 by the controller 31 may include controlling an electronic switch 33 connected in series with the current source 32, wherein the current source 32 drives a charging current into the gate node G when the controller 31 switches on the electronic switch 33 and does not drive a charging current into the gate node G when the controller 31 switches off the electronic switch 33. Controlling the current source 32 by controlling the electronic switch 33 is only one example. Other ways to activate or deactivate the current source 32 by the controller 31 may be implemented as well.

Referring to FIG. 7, the control circuit 3 further includes a first reference voltage source $35_1$ configured to generate a first voltage V1 with the first voltage level and a second reference voltage source $35_2$ configured to generate a second voltage V2 with the second voltage level. A first comparator $36_1$ compares the first voltage V1 with the gate-source $V_{GS}$, and a second comparator $36_2$ compares the second voltage V2 with the gate-source $V_{GS}$. An output signal $S36_1$ of the first comparator $36_1$ is received by the controller 31 and indicates whether the gate-source voltage $V_{GS}$ is above or below the first voltage level V1, and output signal $S36_2$ of the second comparator $36_2$ is received by the controller 31 and indicates whether the gate-source voltage $V_{GS}$ is above or below the second voltage level V2. In the example shown in FIG. 7, comparing the first voltage V1 with the gate-source voltage $V_{GS}$ by the first comparator is obtained in that a first input node of the first comparator $36_1$ is coupled to the first reference voltage source $36_1$ and a second input node of the first comparator $36_1$ is coupled to the gate node G. Equivalently, a first input node of the second comparator $36_2$ is coupled to the second reference voltage source $35_2$ and a second input node of the second comparator $36_2$ is coupled to the gate node G. Circuit nodes of the first and second reference voltage sources $35_1$, $35_2$ facing away from the first and second comparator $36_1$, $36_2$ are connected to the second node of the electronic circuit 2 in this example.

Operation of the control circuit 3 shown in FIG. 7 in order to evaluate the gate-source resistance $R_{GS}$ is as follows. Before discharging the gate-source capacitance $C_{GS}$ in the first step 101 explained with reference to FIG. 4, the controller 31 switches on the electronic switch 33 so that the gate-source capacitance $C_{GS}$ is charged by the current source 32. According to one example, the controller 31 switches on the electronic switch 33 long enough for the gate-source voltage $V_{GS}$ to rise above the first voltage level V1. According to one example, the controller 31 switches on the electronic switch 33 long enough for the gate-source voltage $V_{GS}$ to increase to a voltage level $V_{SUP}$ of a supply voltage provided by the supply voltage source 34. According to another example (illustrated in dashed lines in FIG. 7) the control circuit 3 includes a further reference voltage source $35_0$ which provides a reference voltage with a voltage level V0, wherein this voltage level V0 is between the first voltage level $V_1$ and the supply voltage level $V_{SUP}$. In this example, the controller 31 monitors the gate-source voltage $V_{GS}$ when the electronic switch 33 is switched on, and switches off the electronic switch 33 when the gate-source voltage $V_{GS}$ has reached the third voltage level V0. After the controller 31 has switched off the electronic switch 33, the gate-source capacitance $C_{GS}$ is discharged by the parallel circuit with the first resistor 21 and the gate-source resistance $R_{GS}$. The controller 31 monitors the gate-source voltage $V_{GS}$ and, when the gate-source $V_{GS}$ has reached the first voltage level V1 starts to measure the first discharging time T1. The controller 31 further monitors the gate-source voltage $V_{GS}$ and stops measuring when the gate-source voltage $V_{GS}$ has decreased to the second voltage level V2. The time between the beginning and the end of this measurement is the first discharging time T1.

After the first discharging time T1 has been measured, the controller 31 again switches on the electronic switch 33 in order to again charge the gate-source capacitance $C_{GS}$. After the gate-source capacitance $C_{GS}$ has been recharged the controller 31 switches off the electronic switch 33 and switches on the electronic switch 23 (which may already be switched on before recharging) connected in series with the second resistor 22 so that the gate-source capacitance $C_{GS}$ is now discharged by the parallel circuit with the first resistor 21, the second resistor 22 and the gate-source resistance $R_{GS}$. The controller 31 again measures the time between the time instance when the gate-source voltage $V_{GS}$ reaches (crosses) the first voltage level V1 and the time instance when the gate-source voltage $V_{GS}$ reaches (crosses) to the second voltage V2. This time equals the second discharging time T2.

Inevitably, there may be delay times between the times when the gate-source voltage $V_{GS}$ reaches the first and second voltage levels V1, V2 and those times when the controller begins and ends measuring the first discharging time T1 and the second discharging time T2. However, as these delays occur at the beginning and the end of the measurement in the same way, they do not negatively affect measuring the first and second discharging time T1, T2.

Figure 8:
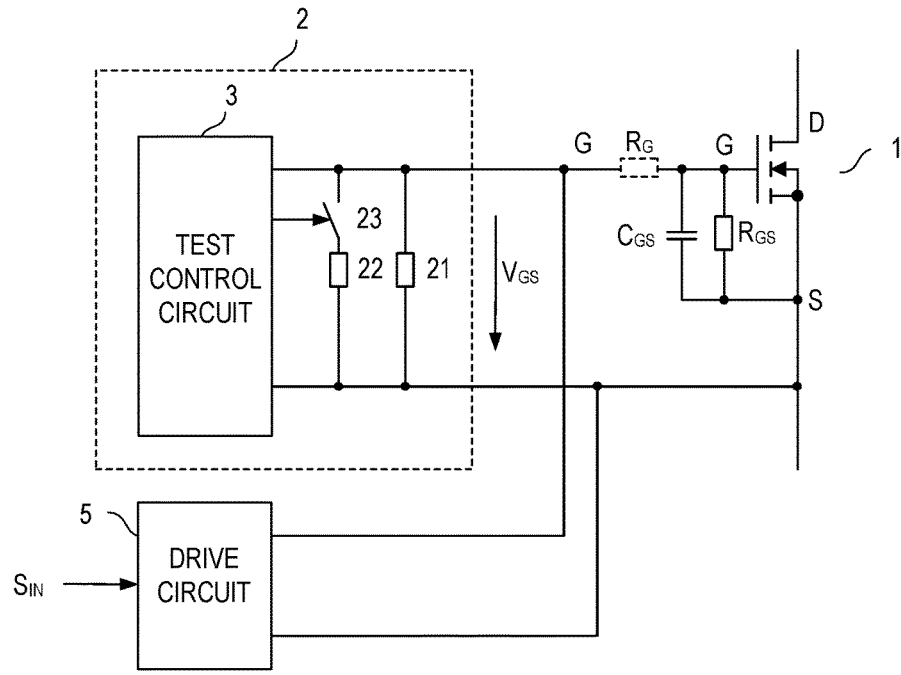
FIG. 8 shows an electronic with a transistor device, an electronic circuit, and a drive circuit.

According to one example, the electronic circuit 2 is a dedicated circuit that is only used for evaluating the gate-source resistance $R_{GS}$. In this case, referring to FIG. 8, a drive circuit 5 may be connected to the gate node G and the source node S of the transistor device 1. This drive circuit 5 may be configured to switch on or switch off the transistor device 1 by charging or discharging the gate-source capacitance $C_{GS}$ dependent on an input signal $S_{IN}$.

Figure 9:
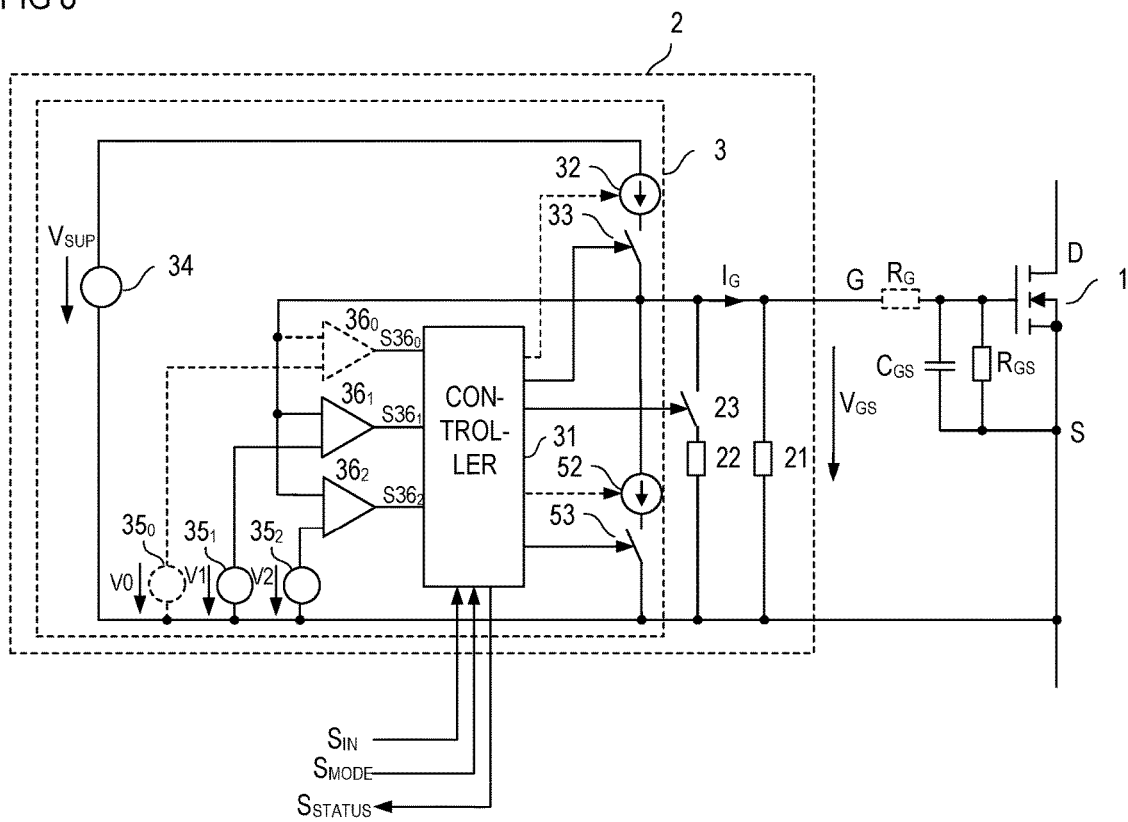
FIG. 9 shows one example of a drive circuit that includes an electronic circuit.

According to another example shown in FIG. 9, the electronic circuit 3 is not only configured the evaluate the gate-source capacitance $C_{GS}$, but is further configured to switch on or switch off the transistor device 1 dependent on an input signal $S_{IN}$. In this example, the electronic circuit 3 is configured to operate in one of two operating modes depending on an operating mode signal $S_{MODE}$, a test mode and a drive mode. In the test mode, the electronic circuit 3 evaluates the gate-source resistance $R_{GS}$ in the way explained herein above. In the drive mode, the electronic circuit 3 drives the transistor device 1 based on the input signal $S_{IN}$.

In the example shown in FIG. 9, the controller 31 receives the input signal $S_{IN}$ and the operation mode signal $S_{MODE}$ and operates the electronic circuit 3 either in the test mode or the drive mode. Besides the components explained with reference to FIG. 7, the electronic circuit 3 additionally includes a further current source 52 coupled between the first node and the second node, so that the second current source 52 is connected between the gate node G and the source node S of the transistor device 1, when connected to the electronic circuit 2. The controller 31 is configured to control this further current source 52. The controller may control (activate or deactivate) the further current source 53 by controlling a further electronic switch 53 connected in series with the further current source 52 (as illustrated in FIG. 9) or in any other way.

The further current source 52 is used in the drive mode to discharge the gate-source capacitance $C_{GS}$ and switch off the transistor device 1. Optionally, the current source 32 and/or the further current source 52 are adjustable current sources. That is, a current level of a current provided by the respective current source 32, 52 is adjustable by the controller 31. In the test mode, the electronic circuit 2 shown in FIG. 9 may operate in the same way as the electronic circuit shown in FIG. 7. In the drive mode, the controller 31 activates or deactivates the current sources 32, 52, for example, by switching on or switching off the associated switches 33, 53 dependent on the input signal $S_{IN}$. In particular, the controller 31 activates the current source 32 and deactivates the further current source 52 when the input signal $S_{IN}$ indicates that it is desired to switch on the transistor device 1. When the input signal $S_{IN}$ indicates that it is desired to switch off the transistor device 1, the controller 31 deactivates the current source 32 and activates the further current source 52. The latter discharges the gate-source capacitance $C_{GS}$ in order to switch off the transistor device 1. In the drive mode, the first resistor 21 provides a safety function. The first resistor 21 discharges the gate-source capacitance $C_{GS}$ when the further current source 52 is defect and fails to discharge the gate-source capacitance $C_{GS}$. The resistor 21, however, discharges the gate-source capacitance $C_{GS}$ much slower than the current source 52, so that the resistor 21 does not significantly affect driving the transistor device 1 by the current source 32 and the further current source 52 when the electronic circuit 2 operates correctly.

Figure 10:
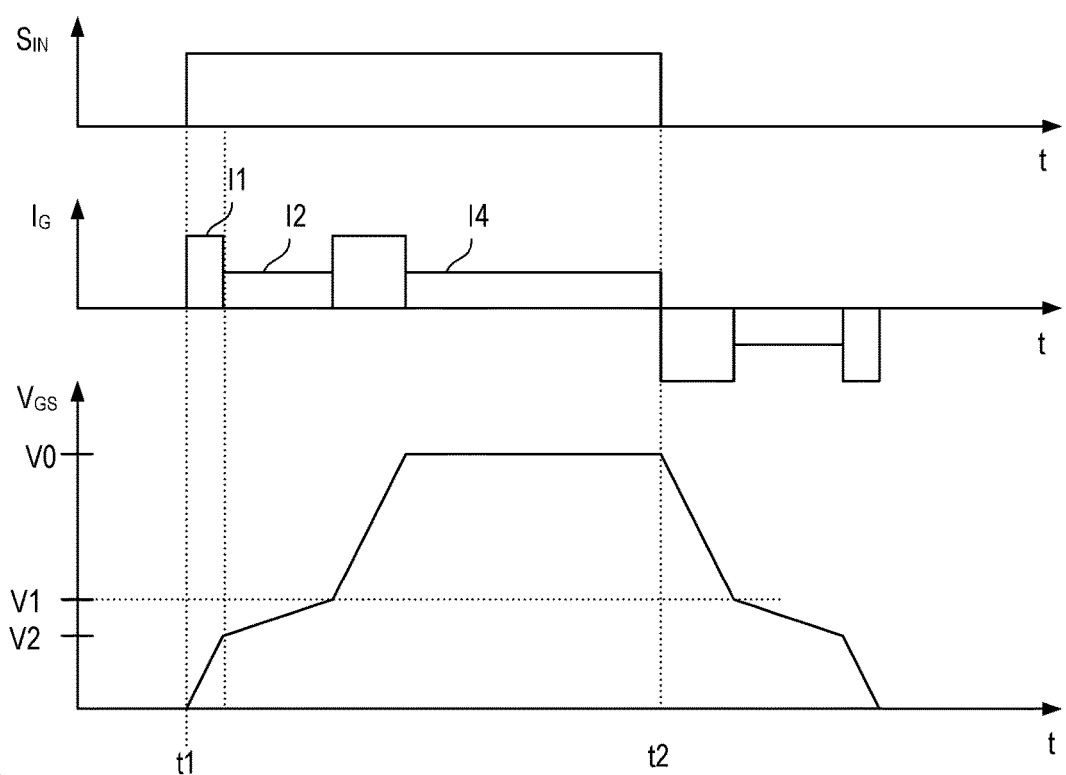
FIG. 10 shows signal waveforms that illustrate operation of the drive circuit shown in FIG. 9.

According to one example, at least one of the reference voltage levels V0, V1 and V2 is used by the electronic circuit 2 in the drive mode. This is explained with reference to FIG. 10. FIG. 10 shows signal waveforms of the input signal $S_{IN}$, a gate current IG and the gate-source voltage $V_{GS}$. In this example, the controller 31 adapts the gate current IG driven into the gate node G by adjusting the current level of the current provided by the current source 32 dependent on the gate-source voltage $V_{GS}$. In the example shown in FIG. 10, t1 denotes a time instance when a signal level of the input signal $S_{IN}$ changes from an off-level (which is represented by a low signal level in FIG. 10) to an on-level (which is represented by a high signal level in FIG. 10). When the signal level of the input level $S_{IN}$ changes from the off-level to the on-level, the controller 31 controls the current source 32 such that it provides a gate current IG with a first current level I1. When the gate-source voltage $V_{GS}$ reaches the second voltage level V2, the controller 31, by controlling the current source 32, reduces the current level of the gate current $I_G$ to a second level I2 lower than the first level I1 until the gate-source voltage $V_{GS}$ reaches the first voltage level V1. After the gate-source voltage $V_{GS}$ has reached the first voltage level V1, the controller 31, by controlling the current source 32, increases a current level of the gate current $I_G$ to a third level I3, which is higher than the second level I2. The third level I3 may be equal to the first level I1 or may be different from the first level I1. Optionally, as illustrated in FIG. 10, the controller 31 reduces the current level of the gate current $I_G$ to a fourth level I4 when the gate-source voltage $V_{GS}$ reaches the third level V0. According to one example, the second voltage level V2 is selected such that it substantially equals the threshold voltage of the transistor device 1. By the drive sequence illustrated in FIG. 10, the gate-source capacitance $C_{GS}$ is rapidly charged by the first current level I1 until the transistor device 1 switches on and enters the Miller phase. During the Miller phase the current is reduced to the second level I2 and, after the Miller phase, is again increased (to the third level I3). The end of the Miller phase is represented by the first voltage level V2 in this example. According to one example, the second voltage level V2 is selected from a range of between 0.5V and 1.5V and the first voltage level V1 is selected from a range of between 2V and 5V. The optionally third voltage level V0 is, for example, selected from a range of between 7V and 12V. The fourth current level I4 may be selected such that it keeps the gate-source voltage $V_{GS}$ on the third level V0. In particular, this fourth current level I4 is selected such that it compensates a discharging of the gate-source capacitance $C_{GS}$ by the first resistor 21.

When the signal level of the input signal $S_{IN}$ changes from the on-level to the off-level, as illustrated at time t2 in FIG. 10, the controller 31 deactivates the current source 32 and activates the further current source 52. Referring to FIG. 10, switching off the transistor device may include rapidly discharging the gate-source capacitance $C_{GS}$ after the time instance t2 and until the gate-source capacitance $V_{GS}$ reaches the first voltage level V1, slowing down discharging the gate-source capacitance $C_{GS}$ when the gate-source voltage $V_{GS}$ is between the first voltage level V1 and the second voltage level V2, and again rapidly discharging the gate-source capacitance $C_{GS}$ when the gate-source voltage $V_{GS}$ is below the second voltage level V2 and until the gate-source voltage $V_{GS}$ reaches zero. In FIG. 10, the negative current levels of the current $I_G$ after time instance t2 represent current levels of the discharging current, which flows in a current direction opposite the current direction of the charging current. The magnitudes of the current levels of the discharging current in the different phase of the discharging process may be equal to the magnitudes of the charging current in the different phases of the charging current. That is, (1) the magnitude of the gate current $I_G$ in the first phase of the charging process, when the gate-source voltage $V_{GS}$ is between zero and the second voltage level V2 may be equal the magnitude of the gate current in a third phase of the discharging process, when the gate-source voltage $V_{GS}$ is also between zero and the second voltage level V2; (2) the magnitude of the gate current $I_G$ in the second phase of the charging process, when the gate-source voltage $V_{GS}$ is between the second voltage level V2 and the first voltage level V1 may be equal the magnitude of the gate current in a second phase of the discharging process, when the gate-source voltage $V_{GS}$ is also between the second voltage level V2 and the first voltage level V1; and (3) the magnitude of the gate current $I_G$ in the third phase of the charging process, when the gate-source voltage $V_{GS}$ is between the first voltage level V1 and the third voltage level V0 may be equal the magnitude of the gate current in a first phase of the discharging process, when the gate-source voltage $V_{GS}$ is also between the first voltage level V1 and the third voltage level V0.

However, having the same number of phases in the charging and discharging process and having the same magnitude of the current level in corresponding phases of the charging and discharging process is only an example. The discharging process may have more phases or fewer phases than the charging process and these phases may be governed by voltage levels different from the first, second and third level V1, V2, V0 governing the charging process. Further, even if there is the same number of phases in the charging process and the discharging process and the phases in the charging and discharging proves are governed by the same voltage levels the magnitudes of the gate current in corresponding phases may be different.

Referring to examples illustrated in FIGS. 9 and 10, the first and second voltage level V1, V2 may be selected such that the transistor device 1 is in the on-state when the gate-source voltage $V_{GS}$ is between these voltage levels. According to another example, these voltage levels V1, V2 are each selected such that they are below the threshold voltage of the transistor device. This enables testing the transistor device 1 without switching on the transistor device. In an electronic circuit of the type shown in FIG. 9, which can operate in the test mode and the drive mode, additional reference voltage sources and comparators may be provided in this example, reference voltage sources and comparators used for testing the transistor device and reference voltage sources and comparators used for driving the transistor device.

The following examples may illustrate one or more aspects of the disclosure.

Example 1

A method, including: discharging a gate-source capacitance of a transistor device from a first voltage level to a second voltage level with a first resistor being connected in parallel with the gate-source capacitance and measuring a first discharging time associated with the discharging; discharging the gate-source capacitance from the first voltage level to the second voltage level with the first resistor and a second resistor being connected in parallel with the gate-source capacitance and measuring a second discharging time associated with the discharging; comparing a ratio between the first discharging time and the second discharging time with a predefined threshold; and detecting a fault based on the comparing.

Example 2

The method of example 1, wherein the first resistor has a first resistance and the second resistor has a second resistance, wherein the second resistance is m times the first resistance, and wherein a fault is detected if the ratio is smaller than 0.999 times (m+1)/m.

Example 3

The method of example 2, wherein a fault is detected if the ratio is smaller than 0.9 times (m+1)/m.

Example 4

The method of any combination of examples 1 to 3, wherein at least one of the first voltage level and the second voltage level is below a threshold voltage of the transistor device.

Example 5

The method of example 4, wherein each of the first voltage level and the second voltage level is below a threshold voltage of the transistor device.

Example 6

The method of any combination of examples 1 to 5, wherein the transistor device is one of an IGBT and a MOSFET.

Example 7

The method of any combination of examples 1 to 6, further including charging the gate-source capacitance to a voltage level higher than the first voltage level before each of the discharging.

Example 8

A circuit arrangement, including: a transistor device with a gate node, a source node, a gate-source capacitance and between the gate node and the source node, and a gate-source resistance between the gate node and the source node; an electronic circuit connected between the gate node and the source node and comprising a control circuit, a first resistor connected between the gate node and the source node, and a second resistor, wherein the control circuit is configured, in a first test cycle, to measure a first discharging time associated with discharging the gate-source capacitance from a first voltage level to a second voltage level, in a second test cycle, to connect the second resistor between the gate node and the source node and measure a second discharging time associated with discharging the gate-source capacitance from the first voltage level to the second voltage level, to compare a ratio between the first discharging time and the second discharging time with a predefined threshold, and to detect a fault based on the comparing.

Example 9

The circuit arrangement of example 8, further including an electronic switch connected in series with the second resistor, wherein a series circuit with the electronic switch and the second resistor is connected between the gate node and the source node, and wherein connecting the second resistor in parallel with the gate-source capacitance by the control circuit comprises switching on the electronic switch.

Example 10

The circuit arrangement of example 8 or 9, wherein the first resistor has a first resistance and the second resistor has a second resistance, wherein the first resistance is m times the second resistance, and wherein the control circuit is configured to detect a fault if the ratio is smaller than 0.999 times (m+1)/m.

Example 11

The circuit arrangement of any combination of examples 8 to 10, wherein the control circuit includes: a first current source arrangement configured to charge the gate-source capacitance; a comparator arrangement configured to compare a gate-source voltage between the gate node and the source node with the first voltage level and the second voltage level, and to output at least one comparator signal based on the comparing; and a controller configured to receive the at least one comparator signal and measure the first and second discharging time based on the at least one comparator signal.

Example 12

The circuit arrangement of example 11, wherein the first current source arrangement is connected between the gate node and a supply node where a supply potential is available.

Example 13

The electronic circuit of any combination of examples 8 to 12, wherein the electronic circuit further includes a second current source arrangement connected between the gate node and the source node.

Example 14

The circuit arrangement of example 13, wherein the controller is configured to operate in one of a test mode and a drive mode, and wherein the controller, in the drive mode, is configured to drive the first current source arrangement and the second current source arrangement based on an input signal.

Example 15

The circuit arrangement of example 14, wherein the controller is configured, in the drive mode, to activate the first current source arrangement and deactivate the second current source arrangement when the input signal has a first signal level and to deactivate the first current source arrangement and activate the second current source arrangement when the input signal has a second signal level.

Example 16

The circuit arrangement of example 14 or 15, wherein the controller is configured, in the drive mode, to adjust a current provided by the first current source arrangement based on comparing a voltage between the gate node and the source node with at least one of the first voltage level and the second voltage level.

Example 17

The circuit arrangement of any combination of examples 8 to 16, wherein the transistor device is one of an IGBT and a MOSFET.

Example 18

An electronic circuit configured to be connected to a gate node and a source node of a transistor device and including: a first resistor and a second resistor each configured to be connected between the gate node and the source node, and a control circuit, wherein the control circuit is configured, in a first test cycle, to measure a first discharging time associated with discharging the gate-source capacitance from a first voltage level to a second voltage level with the first resistor connected between the gate node and the source node, in a second test cycle, to measure a second discharging time associated with discharging the gate-source capacitance from the first voltage level to the second voltage level with the first resistor and the second resistor connected between the gate node and the source node, to compare a ratio between the first discharging time and the second discharging time with a predefined threshold, and to detect a fault based on the comparing.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method, comprising:
  discharging a gate-source capacitance of a transistor device from a first voltage level to a second voltage level with a first resistor being connected in parallel with the gate-source capacitance and measuring a first discharging time associated with the discharging;
  discharging the gate-source capacitance from the first voltage level to the second voltage level with the first resistor and a second resistor being connected in parallel with the gate-source capacitance and measuring a second discharging time associated with the discharging;
  comparing a ratio between the first discharging time and the second discharging time with a predefined threshold; and
  detecting a fault based on the comparing.

2. The method of claim 1,
  wherein the first resistor has a first resistance and the second resistor has a second resistance,
  wherein the second resistance is m times the first resistance, and
  wherein a fault is detected if the ratio is smaller than 0.999 times (m+1)/m.

3. The method of claim 2, wherein a fault is detected if the ratio is smaller than 0.9 times (m+1)/m.

4. The method of claim 1, wherein at least one of the first voltage level and the second voltage level is below a threshold voltage of the transistor device.

5. The method of claim 4, wherein each of the first voltage level and the second voltage level is below a threshold voltage of the transistor device.

6. The method of claim 1, wherein the transistor device is one of an IGBT and a MOSFET.

7. The method of claim 1, further comprising:
  charging the gate-source capacitance to a voltage level higher than the first voltage level before each of the discharging.

8. A circuit arrangement, comprising:
  a transistor device with a gate node, a source node, a gate-source capacitance and between the gate node and the source node, and a gate-source resistance between the gate node and the source node;

an electronic circuit connected between the gate node and the source node and comprising a control circuit, a first resistor connected between the gate node and the source node, and a second resistor, wherein the control circuit is configured, in a first test cycle, to measure a first discharging time associated with discharging the gate-source capacitance from a first voltage level to a second voltage level, in a second test cycle, to connect the second resistor between the gate node and the source node and measure a second discharging time associated with discharging the gate-source capacitance from the first voltage level to the second voltage level, to compare a ratio between the first discharging time and the second discharging time with a predefined threshold, and to detect a fault based on the comparing.

9. The circuit arrangement of claim 8, further comprising an electronic switch connected in series with the second resistor, wherein a series circuit with the electronic switch and the second resistor is connected between the gate node and the source node, and wherein connecting the second resistor in parallel with the gate-source capacitance by the control circuit comprises switching on the electronic switch.

10. The circuit arrangement of claim 8, wherein the first resistor has a first resistance and the second resistor has a second resistance, wherein the first resistance is m times the second resistance, and wherein the control circuit is configured to detect a fault if the ratio is smaller than 0.999 times (m+1)/m.

11. The circuit arrangement of claim 8, wherein the control circuit comprises:

a first current source arrangement configured to charge the gate-source capacitance;

a comparator arrangement configured to compare a gate-source voltage between the gate node and the source node with the first voltage level and the second voltage level, and to output at least one comparator signal based on the comparing; and a controller configured to receive the at least one comparator signal and measure the first and second discharging time based on the at least one comparator signal.

12. The circuit arrangement of claim 11, wherein the first current source arrangement is connected between the gate node and a supply node where a supply potential is available.

13. The electronic circuit of claim 8, wherein the electronic circuit further comprises:

a second current source arrangement connected between the gate node and the source node.

14. The circuit arrangement of claim 13, wherein the controller is configured to operate in one of a test mode and a drive mode, and wherein the controller, in the drive mode, is configured to drive the first current source arrangement and the second current source arrangement based on an input signal.

15. The circuit arrangement of claim 14, wherein the controller is configured, in the drive mode, to activate the first current source arrangement and deactivate the second current source arrangement when the input signal has a first signal level and to deactivate the first current source arrangement and activate the second current source arrangement when the input signal has a second signal level.

16. The circuit arrangement of claim 14, wherein the controller is configured, in the drive mode, to adjust a current provided by the first current source arrangement based on comparing a voltage between the gate node and the source node with at least one of the first voltage level and the second voltage level.

17. The circuit arrangement of claim 8, wherein the transistor device is one of an IGBT and a MOSFET.

18. An electronic circuit configured to be connected to a gate node and a source node of a transistor device and comprising:

a first resistor and a second resistor each configured to be connected between the gate node and the source node, and a control circuit, wherein the control circuit is configured, in a first test cycle, to measure a first discharging time associated with discharging the gate-source capacitance from a first voltage level to a second voltage level with the first resistor connected between the gate node and the source node, in a second test cycle, to measure a second discharging time associated with discharging the gate-source capacitance from the first voltage level to the second voltage level with the first resistor and the second resistor connected between the gate node and the source node, to compare a ratio between the first discharging time and the second discharging time with a predefined threshold; and to detect a fault based on the comparing.

* * * * *